(12) United States Patent
Kim et al.

(10) Patent No.: US 7,840,926 B2
(45) Date of Patent: Nov. 23, 2010

(54) LAYOUT SCHEMES AND METHODS OF POWER GATING TRANSISTOR SWITCHES, SEMICONDUCTOR DEVICES INCLUDING THE POWER GATING TRANSISTOR SWITCHES, AND POWER GATING METHODS OF THE SEMICONDUCTOR DEVICES

(75) Inventors: Kwang-il Kim, Suwon-si (KR);
Kyoung-kuk Chae, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 530 days.

(21) Appl. No.: 11/812,577

(22) Filed: Jun. 20, 2007

(65) Prior Publication Data

US 2008/0018389 A1      Jan. 24, 2008

(30) Foreign Application Priority Data

Jul. 24, 2006   (KR) ...................... 10-2006-0068957

(51) Int. Cl.
*G06F 17/50* (2006.01)
(52) U.S. Cl. .............................................. 716/8; 716/1
(58) Field of Classification Search .................... 716/1, 716/8–12
See application file for complete search history.

(56) References Cited

U.S. PATENT DOCUMENTS

| 6,492,689 B2 * | 12/2002 | Yamauchi et al. .......... 257/379 |
| 6,800,497 B2 * | 10/2004 | Wang et al. .................... 438/21 |
| 6,876,252 B2 | 4/2005 | Kim et al. |
| 2004/0222817 A1 * | 11/2004 | Madurawe .................... 326/39 |
| 2005/0091630 A1 * | 4/2005 | Madurawe .................... 716/16 |
| 2005/0270074 A1 | 12/2005 | Hardee |
| 2006/0069937 A1 | 3/2006 | Peng |

\* cited by examiner

*Primary Examiner*—Jack Chiang
*Assistant Examiner*—Binh C Tat
(74) *Attorney, Agent, or Firm*—Harness, Dickey & Pierce, P.L.C.

(57) ABSTRACT

A semiconductor device may include a logic circuit and one or more power gating transistor switches. The logic circuit may be connected between a power voltage and a ground voltage, and may perform one or more logic operations. The one or more power gating transistor switches may include a plurality of power gating transistors and poly resistors, and may switch application of the power voltage to the logic circuit according to an active mode, a sleep mode, or active and sleep modes of the logic circuit. The one or more power gating transistor switches may use the poly resistors to sequentially apply the power voltage to the logic circuit, to sequentially block the application of the power voltage to the logic circuit, or to sequentially apply the power voltage to the logic circuit and to sequentially block the application of the power voltage to the logic circuit.

27 Claims, 9 Drawing Sheets

LAYOUT SCHEMES AND METHODS OF POWER GATING TRANSISTOR SWITCHES, SEMICONDUCTOR DEVICES INCLUDING THE POWER GATING TRANSISTOR SWITCHES, AND POWER GATING METHODS OF THE SEMICONDUCTOR DEVICES

PRIORITY STATEMENT

This application claims priority from Korean Patent Application No. 10-2006-0068957, filed on Jul. 24, 2006, in the Korean Intellectual Property Office (KIPO), the entire contents of which are incorporated herein by reference.

BACKGROUND

1. Field

Example embodiments relate to layout schemes of power gating transistor switches, layout methods of power gating transistor switches, semiconductor devices including the power gating transistor switches, and power gating methods of the semiconductor devices. Also, example embodiments relate to layout schemes of power gating transistor switches, layout methods of power gating transistor switches, semiconductor devices including the power gating transistor switches, and power gating methods of the semiconductor devices in which a power voltage and/or a ground voltage may be sequentially applied and/or blocked to a logic circuit, without a separate device or devices, using poly resistors.

2. Description of Related Art

An important issue for mobile devices is low power consumption. Therefore, various low power methods are being developed. One of them is power gating.

Power gating turns power on to a power gating transistor switch to apply a power voltage (or a ground voltage) to a logic circuit including transistors having a relatively low threshold voltage at an active mode of the logic circuit in order to increase an operating speed of the logic circuit, and turns power off to the power gating transistor switch to block the power voltage (or the ground voltage) applied to the logic circuit at a sleep mode in order to reduce leakage current of the logic circuit.

To this end, metal-oxide semiconductor (MOS) transistors having a relatively high threshold voltage are serially connected between the power voltage (or the ground voltage) and the logic circuit. Power gating is very useful to reduce power consumption of a portable large scale integration (LSI) chip that stays quite longer at the active mode than the sleep mode.

Figure 1:
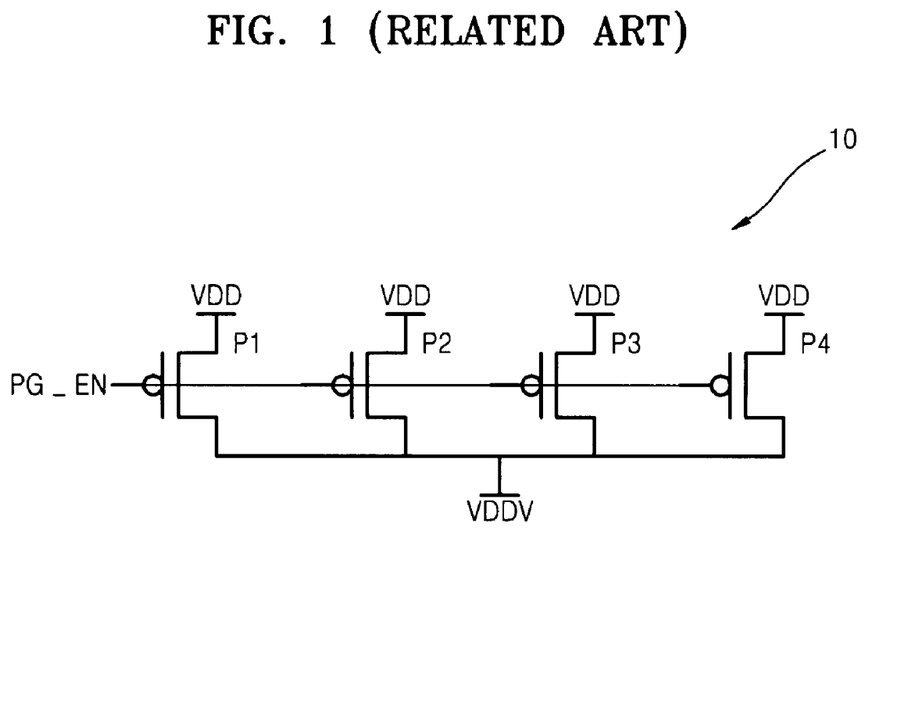
FIG. 1 is a circuit diagram of a part of a related art power gating transistor switch.

FIG. 1 is a circuit diagram of a part of a related art power gating transistor switch 10. Referring to FIG. 1, the related art power gating transistor switch 10 comprises PMOS transistors P1, P2, P3, and P4 that are serially connected between a power voltage VDD and a virtual power voltage VDDV. The virtual power voltage VDDV is applied to a logic circuit (not shown) that performs a predetermined logic operation.

The power gating transistor switch 10 can comprise NMOS transistors (not shown) according to the location thereof. In this case, NMOS transistors (not shown) are serially connected between a ground voltage (not shown) and a virtual ground voltage (not shown).

At an active mode, i.e., when the power voltage VDD is applied to the logic circuit (not shown), the PMOS transistors P1, P2, P3, and P4 are turned on by a power gating enable signal PG_EN of logic low L. The power gating enable signal PG_EN indicates whether a semiconductor device is at the active mode or a sleep mode. The turned-on PMOS transistors P1, P2, P3, and P4 allow the virtual power voltage VDDV to be connected to the power voltage VDD.

In this case, since the logic circuit (not shown) includes low threshold voltage devices, the logic circuit can perform a high performance operation. An amount of leakage current is not quite greater than that of dynamic current, thereby reducing power consumption caused by the leakage current.

Meanwhile, at the sleep mode, the PMOS transistors P1, P2, P3, and P4 are turned off by the power gating enable signal PG_EN of logic high H, so that power is not supplied to the logic circuit (not shown).

However, the PMOS transistors P1, P2, P3, and P4 of the power gating transistor switch 10 are simultaneously turned on or off, causing switching noise. The switching noise can result in malfunction of the logic circuit (not shown).

Figure 2:
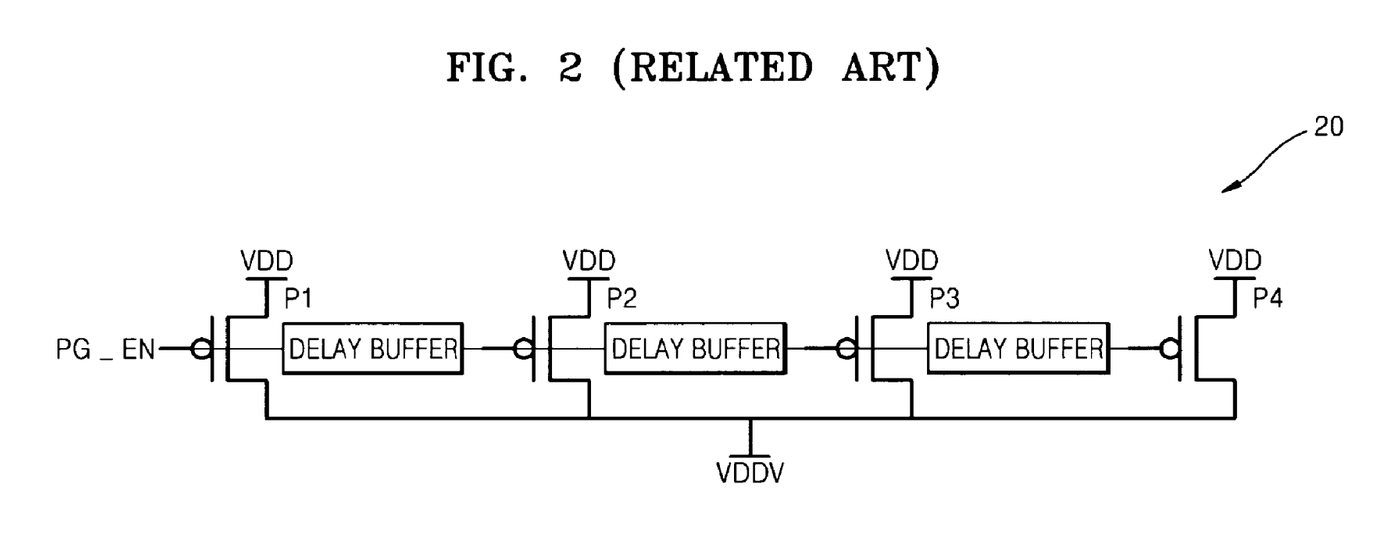
FIG. 2 is a circuit diagram of a part of another related art power gating transistor switch.

FIG. 2 is a circuit diagram of a part of another related art power gating transistor switch 20. Referring to FIG. 2, the power gating transistor switch 20 comprises a control device in order to sequentially turn on or off PMOS transistors P1, P2, P3, and P4. The power gating transistor switch 20 further comprises delay buffers.

The power gating transistor switch 20 sequentially turns on or off the PMOS transistors P1, P2, P3, and P4 using delay buffers, thereby reducing or removing the switching noise occurred in the power gating transistor gate 10 of FIG. 1. However, the power gating transistor switch 20 needs delay buffers and an algorithm for controlling the delay buffers.

For example, the power gating transistor switch 20 involves an increase in chip area and/or control complexity.

SUMMARY

Example embodiments may provide layout schemes of power gating transistor switches, layout methods of power gating transistor switches, semiconductor devices including the power gating transistor switches, and power gating methods of the semiconductor devices in which a power voltage and/or a ground voltage may be sequentially turned on and/or off without a separate device or devices.

According to example embodiments, semiconductor devices may comprise a logic circuit and/or one or more power gating transistor switches. The logic circuit may be connected between a power voltage and a ground voltage. The logic circuit may perform one or more logic operations. The one or more power gating transistor switches may include: a plurality of power gating transistors and/or a plurality of poly resistors associated with the power gating transistors. The one or more power gating transistor switches may switch application of the power voltage to the logic circuit according to an active mode, a sleep mode, or active and sleep modes of the logic circuit. The one or more power gating transistor switches may use the poly resistors to sequentially apply the power voltage to the logic circuit, to sequentially block the application of the power voltage to the logic circuit, or to sequentially apply the power voltage to the logic circuit and to sequentially block the application of the power voltage to the logic circuit.

According to example embodiments, layout schemes of a power gating transistor switch, wherein the power gating transistor switch may include a plurality of power gating transistors, may comprise: active areas; poly gate areas disposed between the active areas; and/or poly areas connecting the poly gate areas. The poly areas may serve as poly resistors.

According to example embodiments, power gating methods of a semiconductor device, wherein the semiconductor device may include a logic circuit that is connected between a power voltage and a ground voltage and/or wherein the logic circuit performs one or more logic operations, may comprise: generating a power gating enable signal having a different logic level according to an active mode, a sleep mode, or active and sleep modes of the logic circuit using a plurality of power gating transistors; and/or switching application of the power voltage to the logic circuit in response to the power gating enable signal or an inversion signal of the power gating enable signal. Switching application of the power voltage to the logic circuit may include: sequentially applying the power voltage to the logic circuit; sequentially blocking application of the power voltage to the logic circuit using poly resistors of the power gating transistors; or sequentially applying the power voltage to the logic circuit and sequentially blocking the application of the power voltage to the logic circuit using the poly resistors of the power gating transistors.

According to example embodiments, layout methods of a power gating transistor switch, wherein the power gating transistor switch may include a plurality of power gating transistors, may comprise: forming active areas; forming poly gate areas between the active areas; and/or forming poly areas connecting the poly gate areas. The poly areas may serve as poly resistors.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Example embodiments will now be described more fully with reference to the accompanying drawings. Embodiments, however, may be embodied in many different forms and should not be construed as being limited to example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 3A:
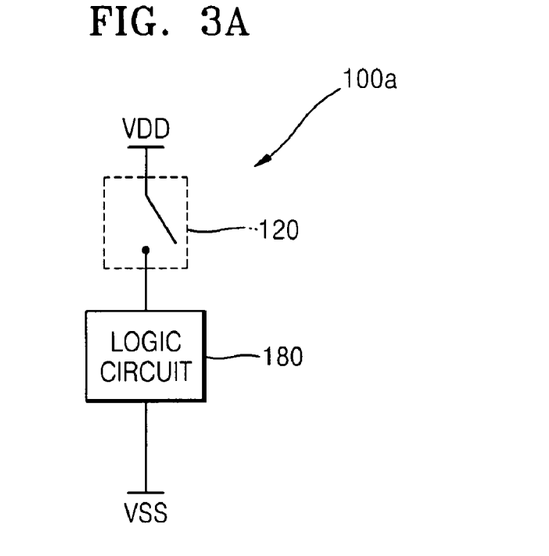
FIGS. 3A through 3C are schematic block diagrams of semiconductor devices that comprise power gating transistor switches according to example embodiments.
Figure 3B:
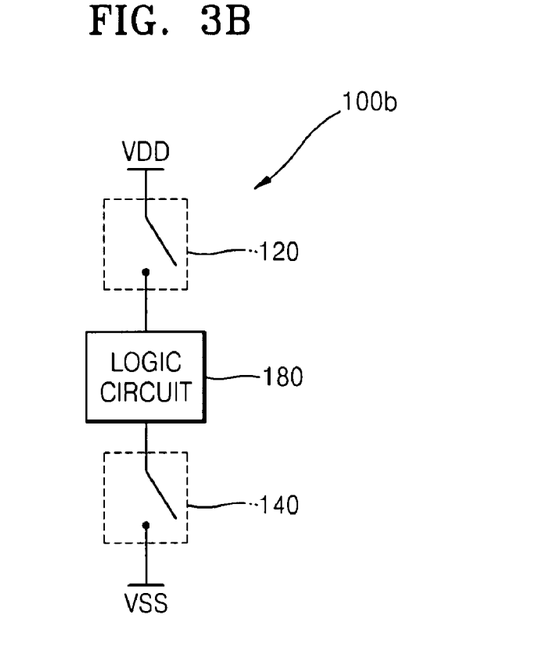
Figure 3C:
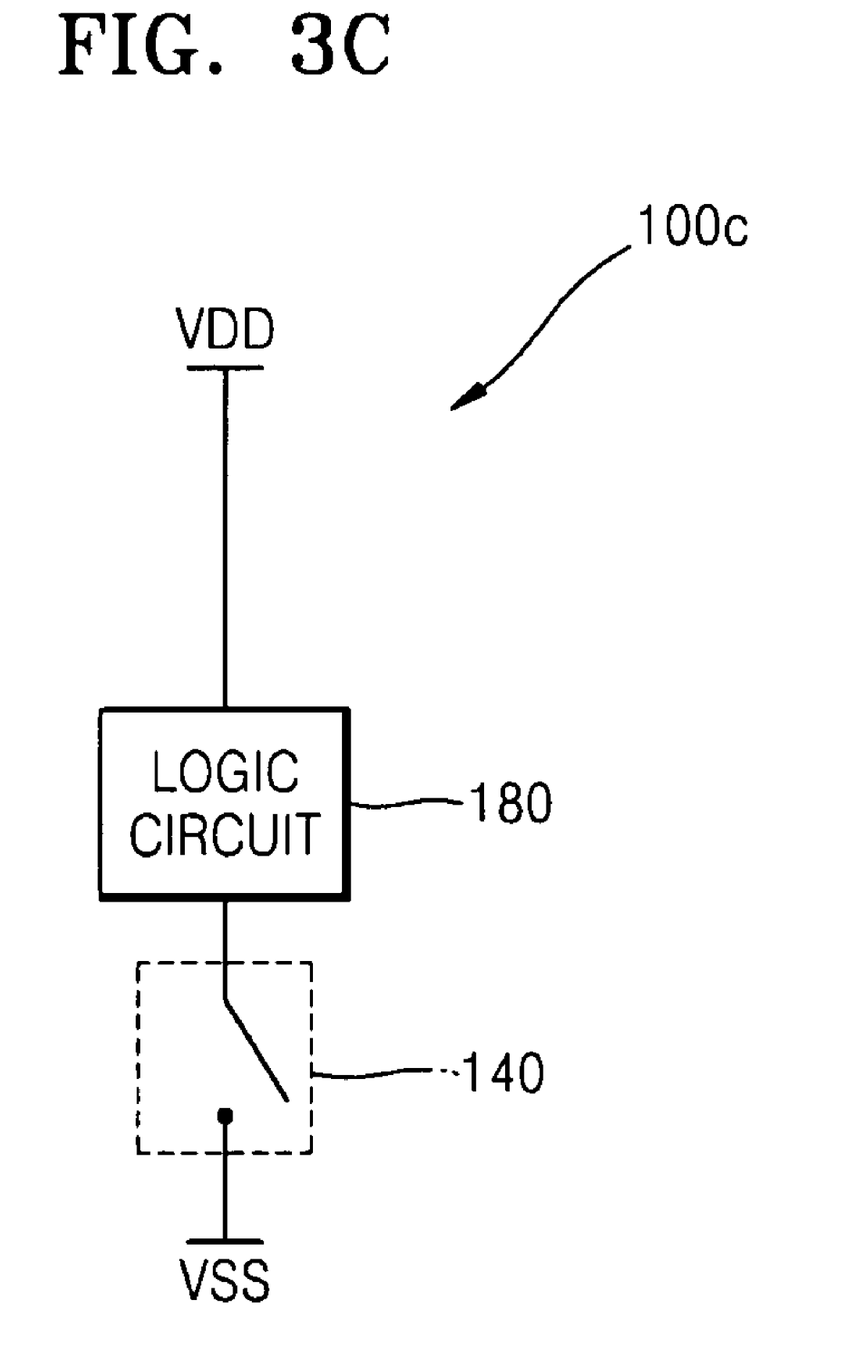

FIGS. 3A through 3C are schematic block diagrams of semiconductor devices 100a, 100b, and 100c that comprise power gating transistor switches 120 and/or 140 according to example embodiments. Referring to FIGS. 3A through 3C, the semiconductor devices 100a, 100b, and 100c may comprise power gating transistor switches according to example embodiments, comprising a logic circuit 180 and/or power gating transistor switches 120 and/or 140. The logic circuit 180 may be connected between a power voltage VDD and a ground voltage VSS to perform one or more logic operations (the logic operation(s) may or may not be predetermined). The power gating transistor switches 120 and/or 140 may switch the application of the power voltage VDD to the logic circuit 180 according to active/sleep modes of the logic circuit 180.

The power gating transistor switches 120 and/or 140 may comprise a plurality of power gating transistors. The power gating transistor switches 120 and/or 140 may comprise a different type of MOS transistor according to the location of the power gating transistor switches 120 and/or 140.

For example, when the power gating transistor switch 120 is disposed between the power voltage VDD and the logic circuit 180, the power gating transistor switch 120 may comprise PMOS transistors. For example, when the power gating transistor switch 140 is disposed between the logic circuit 180 and the ground voltage VSS, the power gating transistor switch 140 may comprise NMOS transistors.

The power gating transistor switches 120 and/or 140 may sequentially apply the power voltage VDD to the logic circuit 180 and/or may sequentially block the power voltage VDD to be applied to the logic circuit 180 using poly resistors of the plurality of power gating transistors. Example operation of the power gating transistor switches 120 and/or 140 will be described below in more detail.

Figure 4:
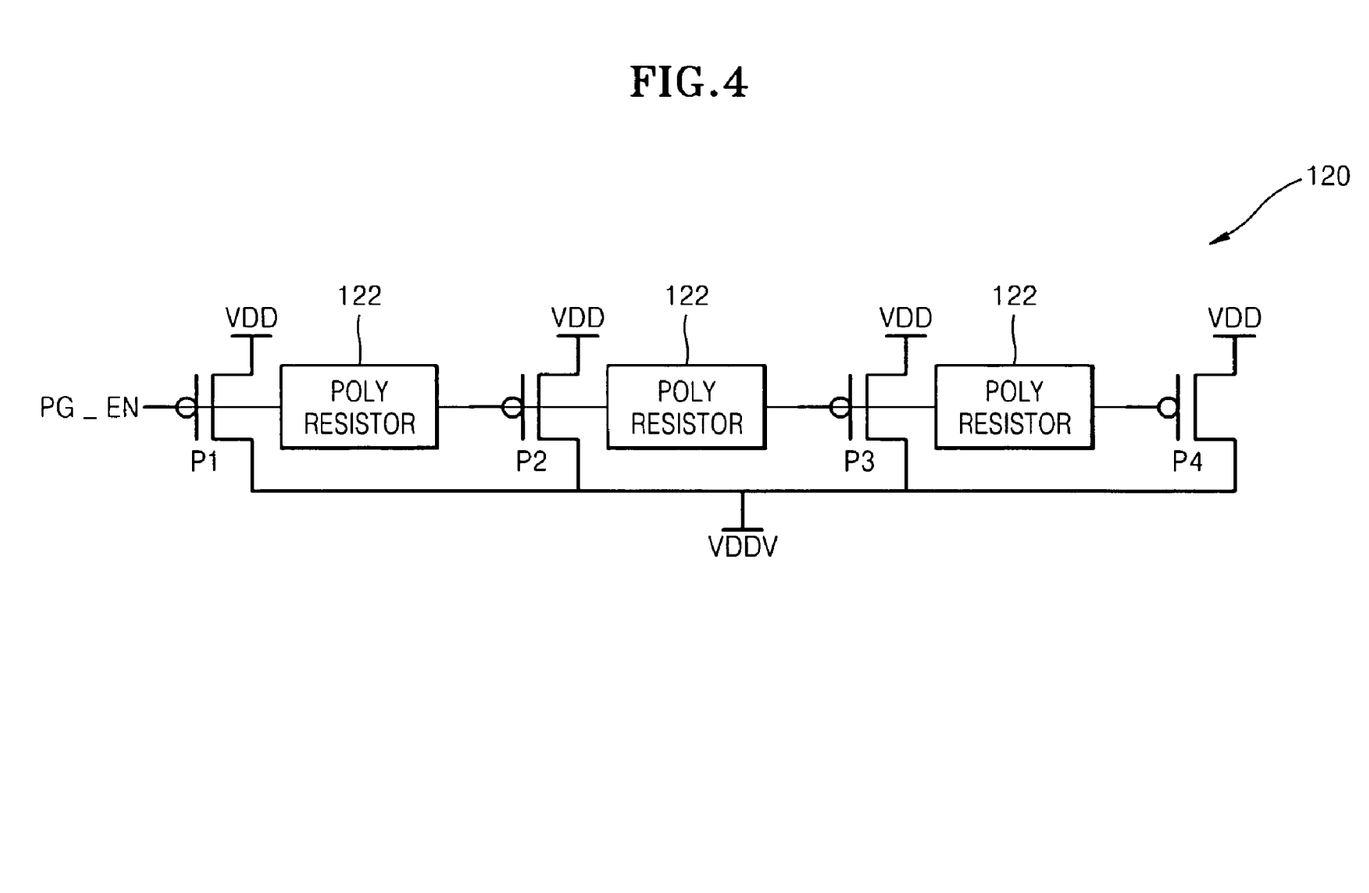
FIG. 4 is a circuit diagram of a part of the power gating transistor switch of FIG. 3A.

FIG. 4 is a circuit diagram of a part of the power gating transistor switch 120 of FIG. 3A. Referring to FIGS. 3A and 4, the power gating transistor switch 120 may be disposed between the power voltage VDD and the logic circuit 180. The power gating transistor switch 120 may comprise PMOS transistors P1, P2, P3, and/or P4.

A first terminal of each of the PMOS transistors P1, P2, P3, and/or P4 may be connected to the power voltage VDD and/or a second terminal of each of the PMOS transistors P1, P2, P3, and/or P4 may be connected to a virtual power voltage VDDV. The virtual power voltage VDDV may be applied to the logic circuit 180. Each gate of the PMOS transistors P1, P2, P3, and/or P4 may be serially connected to each gate of adjacent transistors.

When the logic circuit 180 is at an active mode, i.e., when a power gating enable signal PG_EN is applied to logic low L, the PMOS transistors P1, P2, P3, and/or P4 may be turned on so that the power voltage VDD is applied to the logic circuit 180.

The power gating transistor switch 120 according to example embodiments may comprise poly resistors 122, and thereby may sequentially apply the power voltage VDD to the logic circuit 180. The poly resistors 122 may be disposed between gates of adjacent transistors. The poly resistors 122 may be formed by masking poly areas of the PMOS transistors P1, P2, P3, and/or P4 using, for example, a salicide block masking method.

Figure 5:
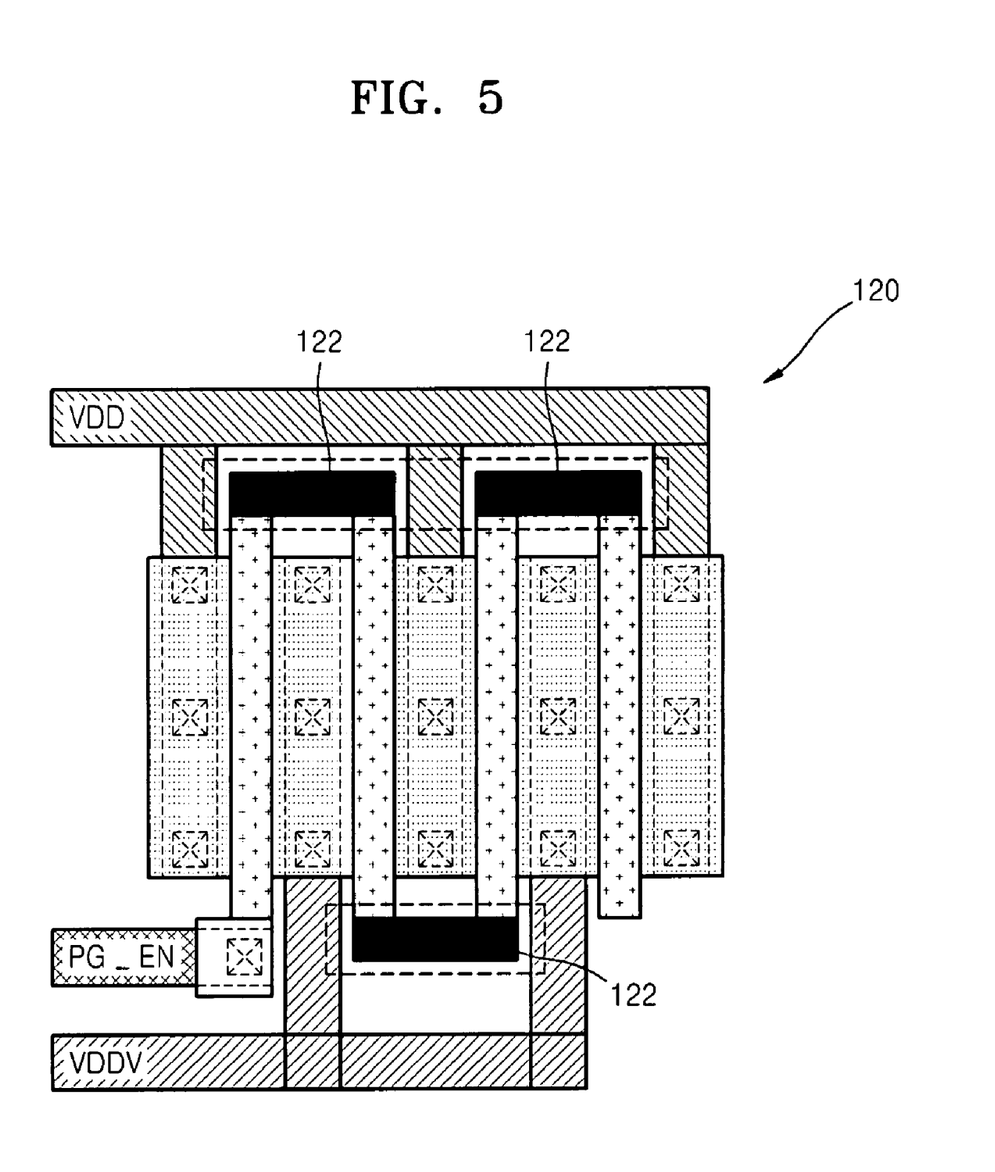
FIG. 5 is a diagram of a layout scheme of the power gating transistor switch of FIG. 4.

FIG. 5 is a diagram of a layout scheme of the power gating transistor switch 120 of FIG. 4. Referring to FIGS. 4 and 5, in order to reduce a resistance component of a transistor, the transistor may be doped with a metal (e.g., cobalt, nickel, platinum, titanium, and/or tungsten), heated, and alloy-processed, which is called salicide. A salicide process may reduce the resistance component of the transistor.

However, the power gating transistor switch 120 of example embodiments may salicide block mask the poly resistors 122 of the PMOS transistors P1, P2, P3, and/or P4 to prevent the resistance component of the poly resistors 122 from being reduced. That is, the power gating transistor switch 120 may comprise the poly resistors 122.

Referring to FIGS. 3A and 4, the poly resistors 122 may be disposed between gates of the PMOS transistors P1, P2, P3, and/or P4 so that the PMOS transistors P1, P2, P3, and/or P4 may not be simultaneously turned on and/or off. For example, the PMOS transistors P1, P2, P3, and/or P4 may be sequentially turned on and/or off so that the power voltage VDD is sequentially applied and/or blocked to the logic circuit 180.

Figure 6:
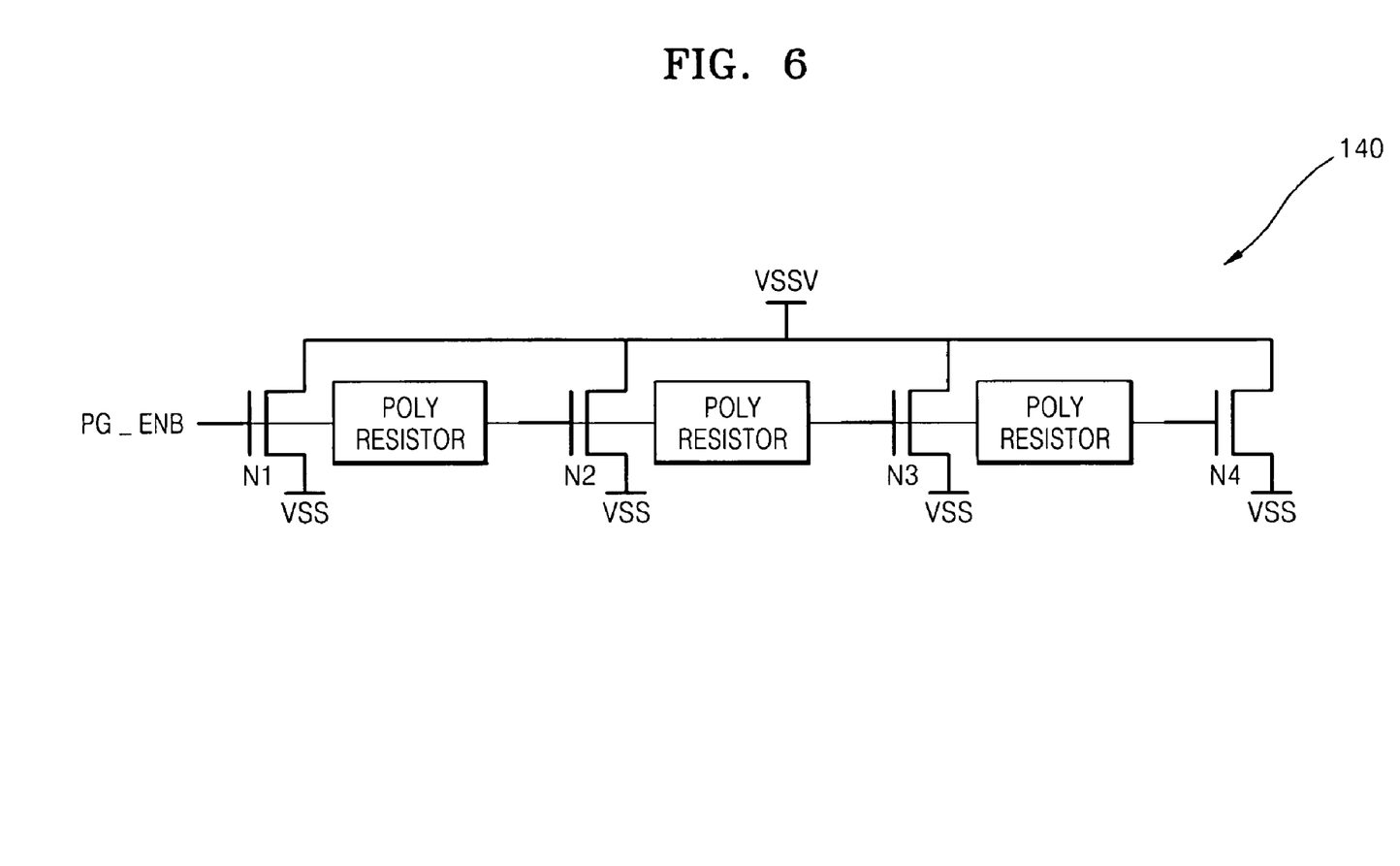
FIG. 6 is a circuit diagram of a part of the power gating transistor switch of FIG. 3C.

FIG. 6 is a circuit diagram of a part of the power gating transistor switch 140 of FIG. 3C. Referring to FIGS. 3C and 6, the power gating transistor switch 140 may be disposed between the logic circuit 180 and the ground voltage VSS.

The power gating transistor switch 140 may comprise a plurality of NMOS transistors N1, N2, N3, and/or N4.

The NMOS transistors N1, N2, N3, and/or N4 may perform similar operations as the PMOS transistors P1, P2, P3, and/or P4 illustrated in FIG. 4. However, the NMOS transistors N1, N2, N3, and/or N4 may be turned on and/or off, for example, by an inversion signal PG_ENB of the power gating transistor switch 140. A first terminal of each of the NMOS transistors N1, N2, N3, and/or N4 may be connected to the ground voltage VSS, and a second terminal of the NMOS transistors N1, N2, N3, and/or N4 may be connected to a virtual ground voltage VSSV.

Referring to FIG. 3B, for example, the semiconductor device 100b may comprise the power gating transistor switches 120 and 140 between the power voltage VDD and the logic circuit 180 and between the logic circuit 180 and the ground voltage VSS, respectively. The power gating transistor switches 120 and 140 may be identical to the power gating transistor switches 120 and 140 illustrated in FIGS. 4 and 6.

The semiconductor devices 100a, 100b, and 100c comprising the power gating transistor switches 120 and/or 140 according to example embodiments may use the poly resistors 122 to sequentially apply and/or block the power voltage VDD to the logic circuit 180 without a separate device or devices. Therefore, chip area may be reduced and/or switching noise may be reduced or eliminated.

Figure 7:
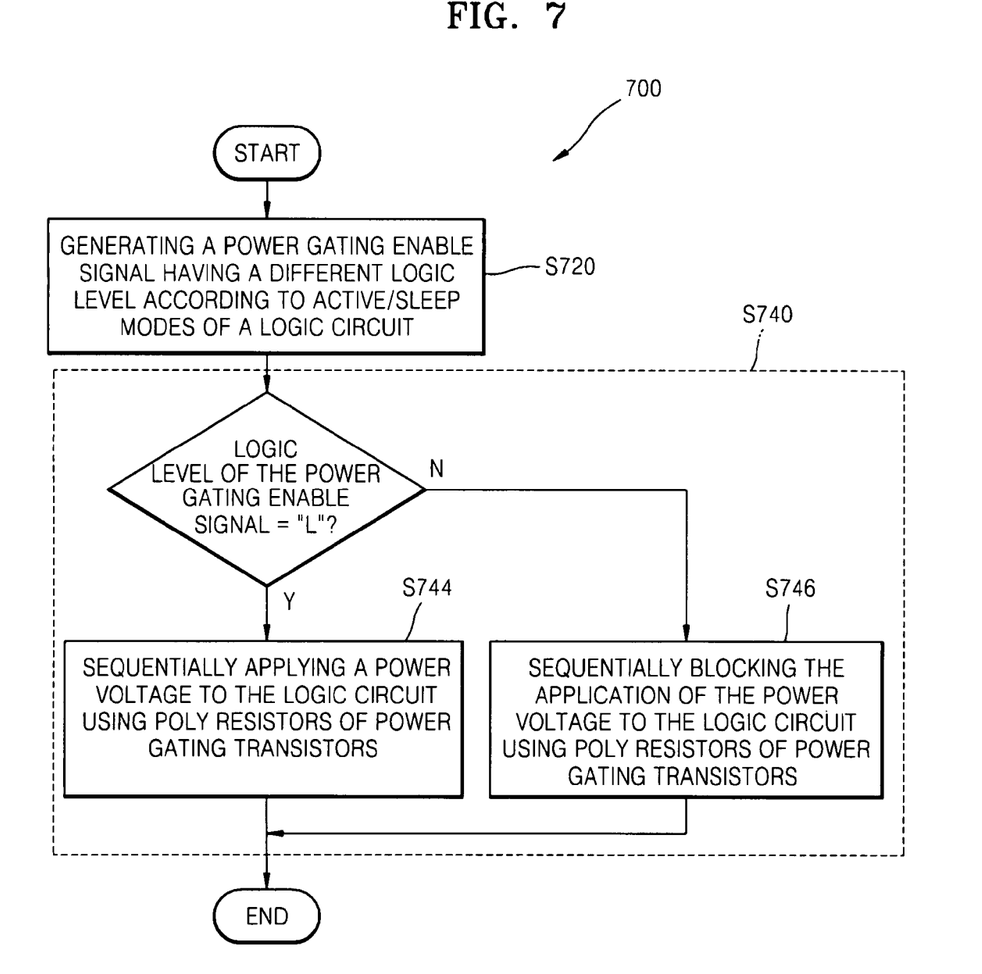
FIG. 7 is a flowchart illustrating a power gating method of a semiconductor device according to example embodiments.

FIG. 7 is a flowchart illustrating a power gating method 700 of a semiconductor device according to example embodiments. Referring to FIG. 7, the power gating method 700 of the semiconductor device according to example embodiments may comprise generating a power gating enable signal having a different logic level according to active/sleep modes of a logic circuit using a plurality of power gating transistors (operation S720), and/or switching the application of a power voltage to the logic circuit in response to the power gating enable signal or to an inversion signal of the power gating enable signal (operation S740).

In operation S740, poly resistors of the power gating transistors may be used to sequentially apply the power voltage to the logic circuit (operation S744) and/or to sequentially block the application of the power voltage to the logic circuit (operation S746).

Figure 8:
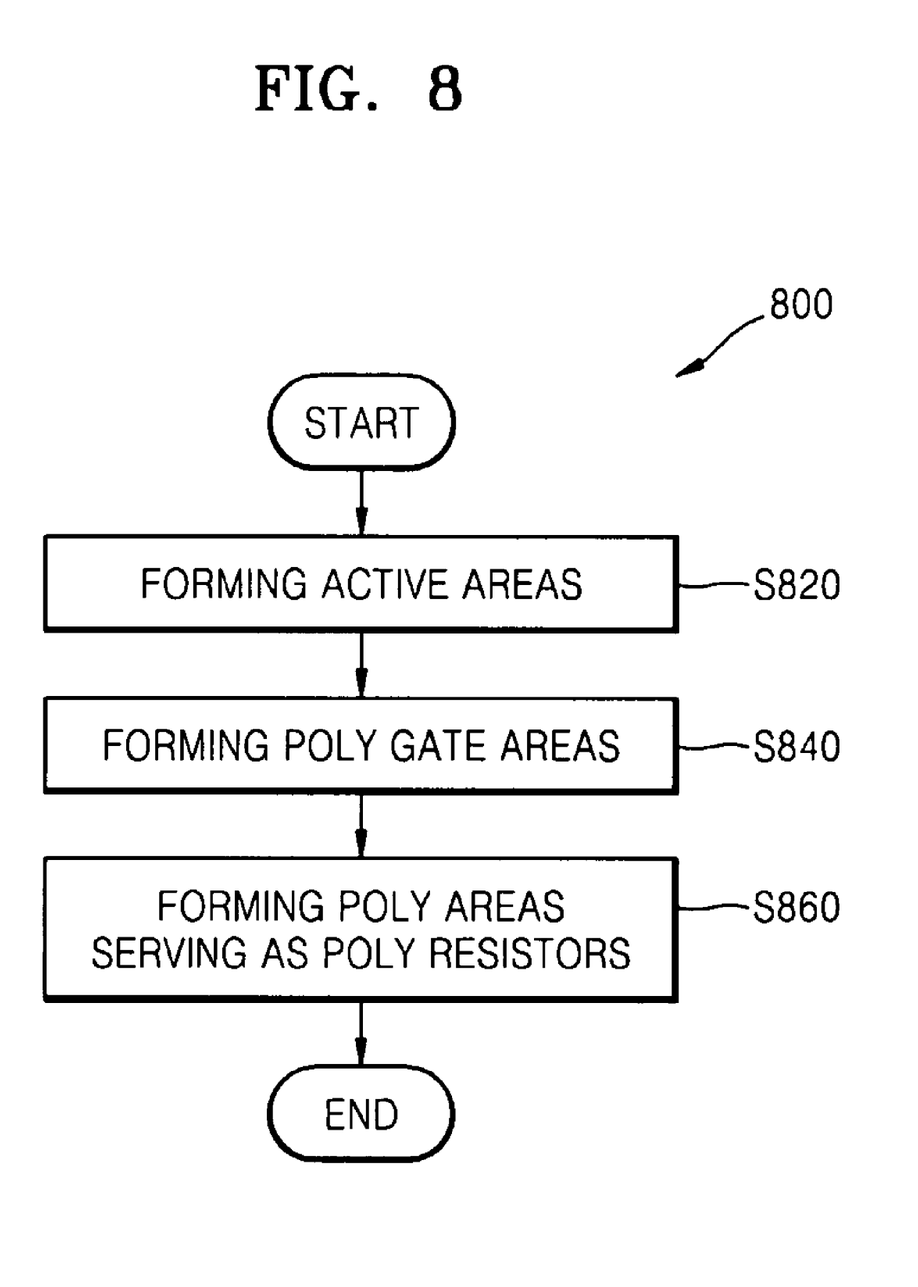
FIG. 8 is a flowchart illustrating a layout method of a power gating transistor switch according to example embodiments.

FIG. 8 is a flowchart illustrating a layout method 800 of a power gating transistor switch according to example embodiments. Referring to FIG. 8, the layout method 800 of the power gating transistor switch according to example embodiments may comprise forming active areas (operation S820), forming poly gate areas between the active areas (operation S840), and/or forming poly areas connecting the poly gate areas (operation S860). The poly areas may serve as poly resistors.

The poly resistors may be formed by masking the poly areas as described above. In detail, the power gating method 700 of the semiconductor device and/or the layout method 800 of the power gating transistor switch according to example embodiments may sequentially apply and/or block the power voltage to the logic circuit using the poly resistors formed by salicide block masking the poly areas of power gating transistors.

The power gating method 700 of the semiconductor device and/or the layout method 800 of the power gating transistor switch according to example embodiments may be similar or identical to the semiconductor devices and/or the layout scheme of the power gating transistor switches as described above. Therefore, those of ordinary skill in the art to which the example embodiments pertain may understand the power gating method 700 of the semiconductor device and/or the layout method 800 of the power gating transistor switch according to example embodiments and, thus, detailed description thereof is omitted.

According to the layout scheme and/or layout method of a power gating transistor switch of example embodiments, a semiconductor device may sequentially apply and/or block a power voltage to a logic circuit without a separate device or devices, and may thereby reduce chip area and/or reduce or eliminate switching noise.

While example embodiments have been particularly shown and described, it will be understood by those of ordinary skill in the art that various changes in form and details may be made therein without departing from the spirit and scope of the present invention as defined by the following claims.

What is claimed is:

1. A semiconductor device, comprising:
a logic circuit; and
one or more power gating transistor switches;
wherein the logic circuit is connected between a power voltage and a ground voltage,
wherein the logic circuit performs one or more logic operations,
wherein the one or more power gating transistor switches include:
a plurality of power gating transistors; and
a plurality of poly resistors associated with the power gating transistors;
wherein the one or more power gating transistor switches are turned on by a power gating enable signal having a different logic level according to an active mode, a sleep mode, or active and sleep modes of the logic circuit in order to switch application of the power voltage to the logic circuit in response to the power gating enable signal or an inversion signal of the power gating enable signal,
wherein the one or more power gating transistor switches use the poly resistors to sequentially apply the power voltage to the logic circuit, to sequentially block the application of the power voltage to the logic circuit, or to sequentially apply the power voltage to the logic circuit and to sequentially block the application of the power voltage to the logic circuit, and
wherein the poly resistors are between gates of adjacent power gating transistors.

2. The semiconductor device of claim 1, wherein the poly resistors are formed by masking poly areas of the power gating transistors.

3. The semiconductor device of claim 2, wherein the poly areas are masked using a salicide block masking method.

4. The semiconductor device of claim 1, wherein a first terminal of each of the power gating transistors is connected to a first common node,
wherein a second terminal of each of the power gating transistors is connected to a second common node, and
wherein each gate of the power gating transistors is serially connected to each gate of adjacent power gating transistors.

5. The semiconductor device of claim 4, wherein the poly resistors are formed between the gates of the adjacent power gating transistors.

6. The semiconductor device of claim 1, wherein the one or more power gating transistor switches are disposed between the power voltage and the logic circuit.

7. The semiconductor device of claim 4, wherein the power gating transistors are PMOS transistors that are turned on by the power gating enable signal.

8. The semiconductor device of claim 7, wherein a voltage of the first common node is the power voltage, and
wherein a voltage of the second common node is a virtual power voltage.

9. The semiconductor device of claim 1, wherein the one or more power gating transistor switches are disposed between the logic circuit and the ground voltage.

10. The semiconductor device of claim 4, wherein the power gating transistors are NMOS transistors that are turned on by the inversion signal of the power gating enable signal.

11. The semiconductor device of claim 10, wherein a voltage of the first common node is the ground voltage, and
wherein a voltage of the second common node is a virtual ground voltage.

12. The semiconductor device of claim 1, further comprising:
two or more power gating transistor switches;
wherein at least one of the two or more power gating transistor switches is disposed between the power voltage and the logic circuit, and
wherein at least one of the two or more power gating transistor switches is disposed between the logic circuit and the ground voltage.

13. A layout scheme of at least one of the one or more power gating transistor switches of claim 1, wherein the at least one power gating transistor switch includes the plurality of power gating transistors, the layout scheme comprising:
active areas;
poly gate areas disposed between the active areas; and
poly areas connecting the poly gate areas;
wherein the poly areas serve as the poly resistors.

14. The layout scheme of claim 13, wherein the poly resistors are formed by masking the poly areas.

15. The layout scheme of claim 14, wherein the poly areas are masked using a salicide block masking method.

16. The layout scheme of claim 13, wherein a first terminal of each of the power gating transistors is connected to a first common node,
wherein a second terminal of each of the power gating transistors is connected to a second common node, and
wherein each gate of the power gating transistors is serially connected to each gate of adjacent power gating transistors.

17. The layout scheme of claim 16, wherein the poly resistors are formed between the gates of the adjacent power gating transistors.

18. A power gating method of the semiconductor device of claim 1, the power gating method comprising:
generating the power gating enable signal having a different logic level according to the active mode, the sleep mode, or the active and sleep modes of the logic circuit using the plurality of power gating transistors; and
switching application of the power voltage to the logic circuit in response to the power gating enable signal or an inversion signal of the power gating enable signal.

19. The power gating method of claim 18, wherein the poly resistors are formed by masking poly areas of the power gating transistors.

20. The power gating method of claim 19, wherein the poly areas are masked using a salicide block masking method.

21. The power gating method of claim 18, wherein a first terminal of each of the power gating transistors is connected to a first common node,
wherein a second terminal of each of the power gating transistors is connected to a second common node, and wherein each gate of the power gating transistors is serially connected to each gate of adjacent power gating transistors.

22. The power gating method of claim 21, wherein the poly resistors are formed between the gates of the adjacent power gating transistors.

23. A layout method of at least one of the one or more power gating transistor switches of claim 1, wherein the at least one power gating transistor switch includes a plurality of power gating transistors, the layout method comprising:
   forming active areas;
   forming poly gate areas between the active areas; and
   forming poly areas connecting the poly gate areas;
   wherein the poly areas serve as the poly resistors.

24. The layout method of claim 23, wherein the poly resistors are formed by masking the poly areas.

25. The layout method of claim 24, wherein the poly areas are masked using a salicide block masking method.

26. The layout method of claim 23, wherein a first terminal of each of the power gating transistors is connected to a first common node,
   wherein a second terminal of each of the power gating transistors is connected to a second common node, and
   wherein each gate of the power gating transistors is serially connected to each gate of adjacent power gating transistors.

27. The layout method of claim 26, wherein the poly resistors are formed between the gates of the adjacent power gating transistors.

* * * * *